US012652862B2

(12) United States Patent
Hiraoka

(10) Patent No.: US 12,652,862 B2
(45) Date of Patent: Jun. 9, 2026

(54) PROTECTION CIRCUIT AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Takayuki Hiraoka, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 437 days.

(21) Appl. No.: 18/243,325

(22) Filed: Sep. 7, 2023

(65) Prior Publication Data

US 2024/0321867 A1 Sep. 26, 2024

(30) Foreign Application Priority Data

Mar. 23, 2023 (JP) ................................. 2023-047093

(51) Int. Cl.
*H10D 89/60* (2025.01)

(52) U.S. Cl.
CPC ......... *H10D 89/911* (2025.01); *H10D 89/819* (2025.01)

(58) Field of Classification Search
CPC .. H10D 89/911; H10D 89/819; H10D 89/811; H02H 9/041; H02H 9/043
See application file for complete search history.

(56) References Cited

U.S. PATENT DOCUMENTS

| | | | | |
|---|---|---|---|---|
| 2006/0072267 A1* | 4/2006 | Chatty | ............. | H03K 17/08142 |
| | | | | 361/91.1 |
| 2012/0180008 A1* | 7/2012 | Gist, III | ............... | H10D 89/819 |
| | | | | 361/220 |
| 2012/0307406 A1* | 12/2012 | Tatsumi | ................. | H10D 84/85 |
| | | | | 361/56 |
| 2013/0100561 A1* | 4/2013 | Senouci | ............... | H10D 89/819 |
| | | | | 327/564 |

(Continued)

FOREIGN PATENT DOCUMENTS

| | | |
|---|---|---|
| JP | 2013-198126 A | 9/2013 |
| JP | 2014-063854 A | 4/2014 |

(Continued)

OTHER PUBLICATIONS

Japanese Office Action mailed Jan. 20, 2026 in corresponding Japanese Patent Application 2023-047093 with English Translation, 8 pages.

*Primary Examiner* — S M Sohel Imtiaz
(74) *Attorney, Agent, or Firm* — Kim & Stewart LLP

(57) ABSTRACT

According to one embodiment, a protection circuit comprises a first power line, a second power line, a first transistor, a first resistor, a second resistor, a second transistor, and a trigger circuit. A drain of the first transistor is connected to the first power line. A source of the first transistor is connected to the second power line. A drain of the second transistor is connected to the first power line. A source of the second transistor is connected to a first node. The trigger circuit is connected to each of the first node and the second power line. The trigger circuit is configured to control the first transistor based on a voltage change of the first node.

8 Claims, 3 Drawing Sheets

(56) References Cited

U.S. PATENT DOCUMENTS

| | | | | |
|---|---|---|---|---|
| 2014/0078624 A1* | 3/2014 | Nagamatsu | .... | H03K 19/017509 |
| | | | | 361/18 |
| 2014/0307354 A1* | 10/2014 | Watanabe | .............. | H02H 9/041 |
| | | | | 361/56 |
| 2014/0368958 A1 | 12/2014 | Ikimura | | |
| 2016/0020606 A1* | 1/2016 | Kato | ...................... | H03K 19/20 |
| | | | | 361/56 |
| 2016/0261105 A1* | 9/2016 | Kato | ......................... | H02H 3/20 |
| 2019/0190256 A1* | 6/2019 | Agarwal | .............. | H02H 1/0007 |
| 2021/0083471 A1* | 3/2021 | Watanabe | .............. | H02H 7/122 |
| 2021/0242677 A1* | 8/2021 | Langguth | ............. | H10D 89/819 |
| 2021/0408786 A1* | 12/2021 | Dundigal | ............. | H10D 89/921 |
| 2022/0384420 A1* | 12/2022 | Ikeda | ................... | H10D 89/811 |
| 2023/0010487 A1* | 1/2023 | Xu | ....................... | H10D 89/911 |

FOREIGN PATENT DOCUMENTS

| | | | |
|---|---|---|---|
| JP | 2014-075435 A | 4/2014 |
| JP | 2014-120547 A | 6/2014 |
| JP | 2015-002510 A | 1/2015 |
| JP | 2020-155586 A | 9/2020 |

* cited by examiner

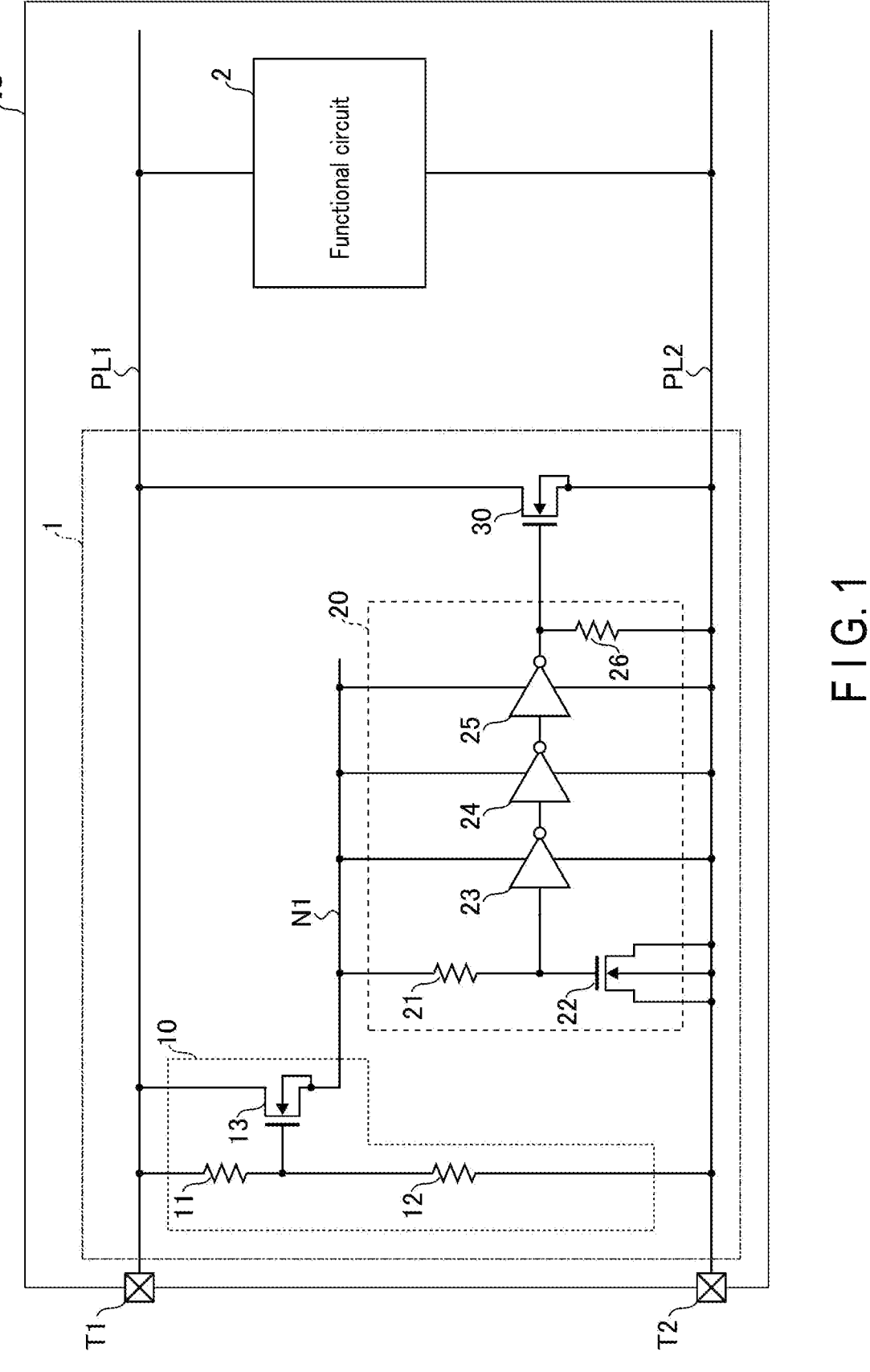
F I G. 1

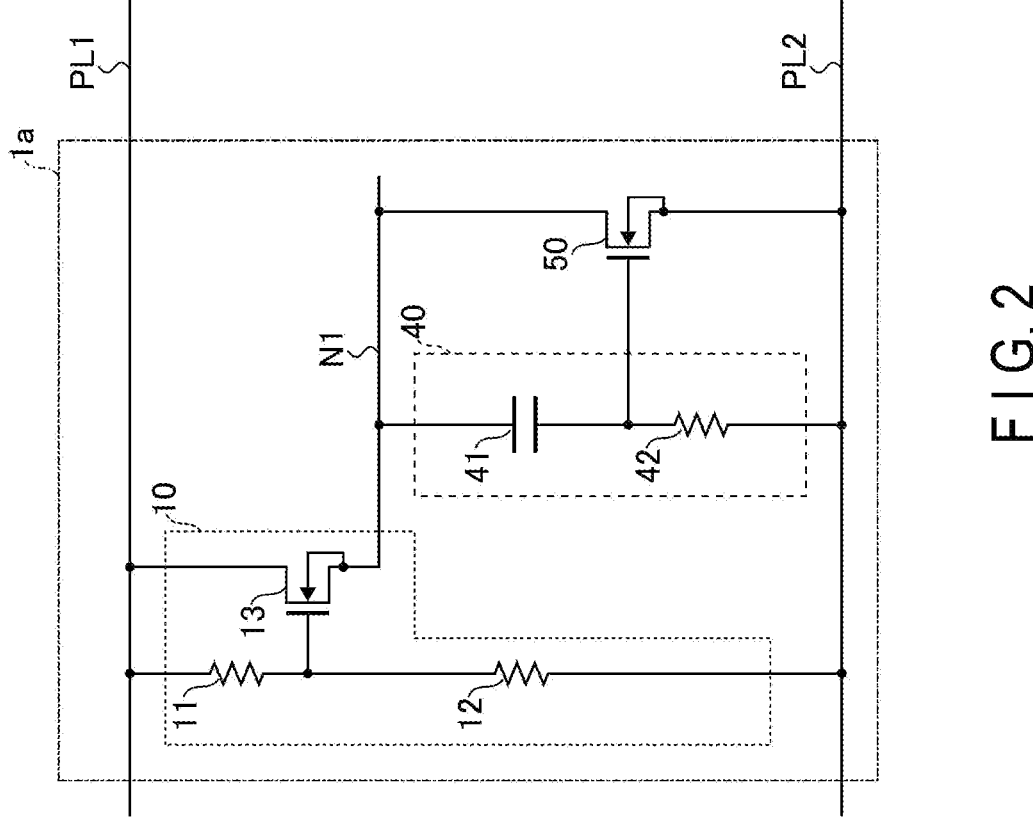
F I G. 2

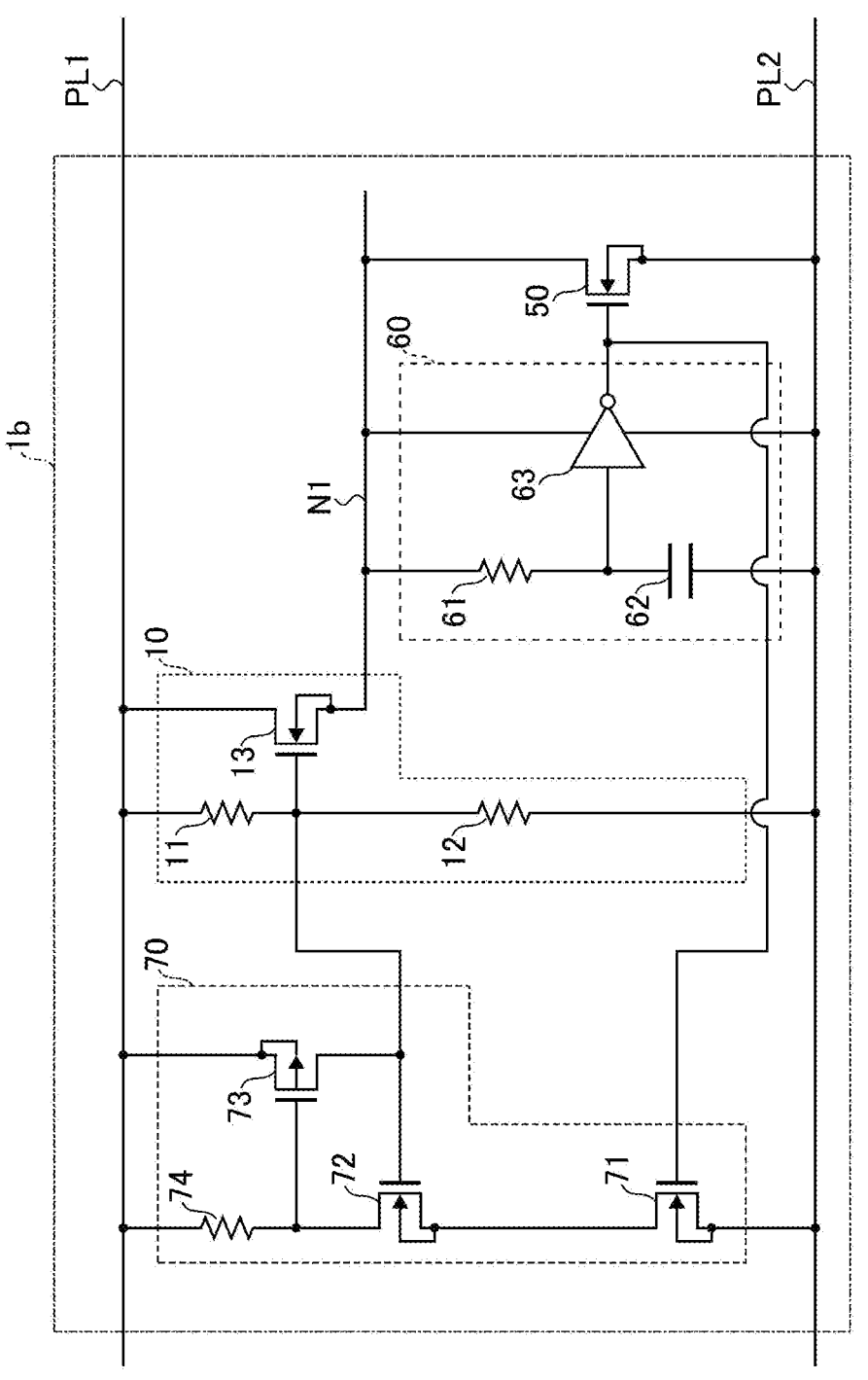
F I G. 3

PROTECTION CIRCUIT AND SEMICONDUCTOR DEVICE

CROSS-REFERENCE TO RELATED APPLICATION(S)

This application is based upon and claims the benefit of priority from Japanese Patent Application No. 2023-047093, filed Mar. 23, 2023, the entire contents of which are incorporated herein by reference.

FIELD

Embodiments described herein relate generally to a protection circuit and a semiconductor device.

BACKGROUND

A protection circuit against electrostatic discharge (ESD) is known.

BRIEF DESCRIPTION OF THE DRAWINGS

FIG. 1 is a circuit diagram showing an exemplary configuration of a semiconductor device including a protection circuit according to an embodiment.

FIG. 2 is a circuit diagram showing an exemplary configuration of a protection circuit according to a first comparative example.

FIG. 3 is a circuit diagram showing an exemplary configuration of a protection circuit according to a second comparative example.

DETAILED DESCRIPTION

In general, according to one embodiment, a protection circuit comprises a first power line, a second power line, a first transistor, a first resistor, a second resistor, a second transistor, and a trigger circuit. A drain of the first transistor is connected to the first power line. A source of the first transistor is connected to the second power line. One end of the first resistor is connected to the first power line. One end of the second resistor is connected to the second power line. A drain of the second transistor is connected to the first power line. A source of the second transistor is connected to a first node. A gate of the second transistor is connected to each of another end of the first resistor and another end of the second resistor. The trigger circuit is connected to each of the first node and the second power line. The trigger circuit is configured to control the first transistor based on a voltage change of the first node.

Embodiments will be described with reference to the drawings. The description will use the same reference symbols for the structural features or components having the same or substantially the same functions and configurations. Also, the description will set forth each embodiment as an example of technical ideas. The embodiments are not intended to bind on materials, shapes, structures, arrangements, etc. of the structural features or components. The embodiments may be modified in various ways.

EMBODIMENTS

A semiconductor device according to some embodiments will be described.

<1> Configuration

<1-1> Overall Configuration of Semiconductor Device

FIG. 1 is a circuit diagram showing an exemplary configuration of a semiconductor device IC including a protection circuit 1 according to an embodiment. The semiconductor device IC is a device for conducting various operations using externally supplied power. In one example, the semiconductor device IC is an integrated circuit (IC) chip.

The semiconductor device IC includes power lines PL1 and PL2, terminals T1 and T2, the protection circuit 1, and a functional circuit 2.

Each of the power lines PL1 and PL2 is an interconnect. The power lines PL1 and PL2 are each used for supplying a source voltage to circuitry components included in the semiconductor device IC.

Each of the terminals T1 and T2 is a supply terminal for the semiconductor device IC. The terminals T1 and T2 are each adapted to be connectable with an entity or entities outside the semiconductor device IC. The terminal T1 is connected to the power line PL1. The terminal T1 is, for example, subjected to application of a source voltage VCCH. The source voltage VCCH is, for example, 40 V. The terminal T2 is connected to the power line PL2. The terminal T2 is, for example, grounded at a ground voltage VSS.

The protection circuit 1 protects one or more circuitry components connected to the power lines PL1 and PL2 against ESD. The protection circuit 1 is connected to the power lines PL1 and PL2.

The functional circuit 2 is a circuit for realizing various operations conducted by the semiconductor device IC. The functional circuit 2 is connected to the power lines PL1 and PL2.

<1-2> Configuration of Protection Circuit 1

With continued reference to FIG. 1, a configuration of the protection circuit 1 will be described.

The protection circuit 1 includes a regulator circuit 10, a trigger circuit 20, and a transistor 30.

The regulator circuit 10 generates, from the source voltage VCCH applied to the power line PL1, a source voltage VCCL lower than the source voltage VCCH and outputs it to a node N1. The source voltage VCCL is, for example, 4 V. The regulator circuit 10 is connected to the power lines PL1 and PL2.

The trigger circuit 20 detects a surge of the source voltage VCCL and controls the transistor 30. The trigger circuit 20 is connected to the power line PL2.

The transistor 30 in this example is an n-type MOSFET. The transistor 30, under the control of the trigger circuit 20, is placed in an ON state to function as a discharging path in the event that ESD occurs to the semiconductor device IC. The transistor 30 has its drain connected to the power line PL1. More specifically, the drain of the transistor 30 is directly connected to the power line PL1 without interposing other transistors. The transistor 30 has its source connected to the power line PL2. More specifically, the source of the transistor 30 is directly connected to the power line PL2 without interposing other transistors. The body of the transistor 30 is connected to the power line PL2. The gate of the transistor 30 is connected to the trigger circuit 20.

The regulator circuit 10 includes resistors 11 and 12, and a transistor 13. The resistor 11 has a resistance of, for example, 700 kΩ. The resistor 12 has a resistance of, for example, 100 kΩ. The transistor 13 in this example is an n-type MOSFET. The threshold voltage for the transistor 13 is, for example, 1 V. The resistor 11 has its one end connected to the power line PL1. The resistor 12 has its one end connected to the power line PL2. The transistor 13 has its gate connected to each of the other end of the resistor 11 and the other end of the resistor 12. The drain of the transistor 13 is connected to the power line PL1. The source of the transistor 13 is connected to the node N1. The body of the transistor 13 is connected to the node N1.

The resistors 11 and 12 connected in series between the power lines PL1 and PL2 divide the source voltage VCCH. In instances where the source voltage VCCH is 40 V, a voltage of 5 V resulting from the voltage division by 700 kΩ of the resistor 11 and 100 kΩ of the resistor 12 is applied to the gate of the transistor 13. The transistor 13 outputs the source voltage VCCL of 4 V, which is smaller by the threshold voltage 1 V than the gate voltage 5 V of the transistor 13, to the node N1.

The trigger circuit 20 includes resistors 21 and 26, a transistor 22, and inverters 23 to 25. The transistor 22 in this example is an n-type MOSFET. The resistor 21 has its one end connected to the node N1. The transistor 22 has its gate connected to the other end of the resistor 21. The drain of transistor 22 is connected to the power line PL2. The source of the transistor 22 is connected to the power line PL2. The body of the transistor 22 is connected to the power line PL2. The inverter 23 has its input end connected to each of the other end of the resistor 21 and the gate of the transistor 22. The inverter 24 has its input end connected to the output end of the inverter 23. The inverter 25 has its input end connected to the output end of the inverter 24. The output end of the inverter 25 is connected to the gate of the transistor 30. The inverters 23 to 25 have their respective positive supply ends connected to the node N1. The inverters 23 to 25 have their respective negative supply ends connected to the power line PL2. The resistor 26 has its one end connected to each of the output end of the inverter 25 and the gate of the transistor 30. The other end of the resistor 26 is connected to the power line PL2.

The transistor 22 in this example is an n-type MOSFET. The transistor 22 here is employed as a capacitor that utilizes a transistor structure. In other words, the gate of the transistor 22 serves as one electrode of the capacitor. The drain, source, and body of the transistor 22 serve as the other electrode of the capacitor.

A node to which the other end of the resistor 21 and the gate of the transistor 22 are connected has a voltage which changes with a delay of an RC time constant from the occurrence of a change in the voltage of the node N1. The RC time constant is determined based on the resistance of the resistor 21 and the capacitance of the capacitor formed by the transistor 22. In one embodiment, the resistance of the resistor 21 and the capacitance of the capacitor formed by the transistor 22 are set to values that will give a sufficiently longer RC time constant than the duration of the instantaneous current inflow caused by an ESD. In other words, the voltage of the node, to which the other end of the resistor 21 and the gate of the transistor 22 are connected, is kept substantially constant for the period during which an ESD-induced instantaneous current inflow takes place.

<2> Operations

The protection circuit 1 according to an embodiment operates in various ways depending on conditions. By way of example, the operations of the protection circuit 1 will be described assuming two conditions, namely, a condition that an ESD occurs to the semiconductor device IC alone, and a condition that the semiconductor device IC is operating in a normal manner with the application of a source voltage.

First, a description will be given of the case where an ESD occurs to the semiconductor device IC alone. Here, the presence of the semiconductor device IC alone refers to an absence of source voltage application, which means that the circuitry components are not in operation and the capacitor formed by the transistor 22 is in a sufficiently discharged state.

If, in this state, an ESD is applied to the terminal T1, the voltage of the power line PL1 is increased by the inflow of a current. The increase in the voltage of the power line PL1 causes the regulator circuit 10 to start operating, and increases the voltage of the node N1. The increase in the voltage of the node N1 causes the trigger circuit 20 to start operating.

The RC time constant, determined by the resistance of the resistor 21 and the capacitance of the capacitor formed by the transistor 22, is sufficiently longer than the duration of the instantaneous current inflow caused by the ESD. As such, the logic level of the node to which the other end of the resistor 21 and the gate of the transistor 22 are connected is judged to be an "L" level by the inverter 23.

The inverter 23 inverts the "L" level and outputs an "H" level to the inverter 24. The inverter 24 inverts the "H" level and outputs an "L" level to the inverter 25. The inverter 25 inverts the "L" level and outputs an "H" level to the gate of the transistor 30. The transistor 30 is thus placed in the ON state. The transistor 30 in the ON state short-circuits the power lines PL1 and PL2 to have the electric charges introduced by the ESD discharged.

In this manner, if an ESD occurs to the semiconductor device IC alone, the transistor 30 is turned ON to short-circuit the power lines PL1 and PL2 so that the semiconductor device IC is protected against the ESD.

Next, a description will be given of the case where the semiconductor device IC is operating in a normal manner with the application of a source voltage. Under the condition that the semiconductor device IC receives a source voltage and is operating normally, the regulator circuit 10 outputs a voltage to the node N1 and the capacitor formed by the transistor 22 is in a sufficiently charged state. As such, the logic level of the node to which the other end of the resistor 21 and the gate of the transistor 22 are connected is judged to be an "H" level by the inverter 23.

The inverter 23 inverts the "H" level and outputs an "L" level to the inverter 24. The inverter 24 inverts the "L" level and outputs an "H" level to the inverter 25. The inverter 25 inverts the "H" level and outputs an "L" level to the gate of the transistor 30. The transistor 30 is thus placed in the OFF state. The transistor 30 in the OFF state does not short-circuit the power lines PL1 and PL2.

In this manner, during the normal operation of the semiconductor device IC with the application of a source voltage, the transistor 30 is kept in the OFF state so that the normal operation of the semiconductor device IC is not disturbed.

<3> Effects

With the protection circuit 1 according to the embodiments described above, manufacturing costs can be reduced. Effects of the protection circuit 1 according to some embodiments will be explained in more detail.

In semiconductor devices, ESD often occurs. For the purpose of protecting a semiconductor device from an ESD, a protection circuit is provided within the semiconductor device.

A protection circuit has a withstand voltage set in accordance with a voltage that is applied under normal use to a semiconductor device in which the protection circuit is provided. If the semiconductor device is intended to receive application of a high voltage under normal use, the protection circuit is also designed to have a sufficiently high withstand voltage.

A component having a high withstand voltage is generally larger in size than a component having a low withstand voltage. Naturally, if a protection circuit is composed of components with a high withstand voltage for realizing a high withstand voltage property, the area of the protection circuit would increase. From the viewpoint of manufacturing costs, it is preferable that the area of a protection circuit be small.

The protection circuit 1 according to one embodiment includes: a power line PL1; a power line PL2; a transistor 30 having a drain connected to the power line PL1 and a source connected to the power line PL2; a resistor 11 having one end connected to the power line PL1; a resistor 12 having one end connected to the power line PL2; a transistor 13 having a drain connected to the power line PL1, a source connected to a node N1, and a gate connected to each of another end of the resistor 11 and another end of the resistor 12; and a trigger circuit 20 connected to each of the node N1 and the power line PL2 and adapted to control the transistor 30 based on a voltage change of the node N1.

In the protection circuit 1 according to the embodiment, a group of the resistor 11, the resistor 12, and the transistor 13, namely, a regulator circuit 10, outputs a source voltage VCCL to the node N1. The trigger circuit 20 operates using the source voltage VCCL. The source voltage VCCL is lower than a source voltage VCCH. Accordingly, the trigger circuit 20 can be formed of a low-withstand-voltage component. This allows for reduction of the area of the protection circuit.

Concrete examples of the high-withstand-voltage component and the low-withstand-voltage component will be discussed, assuming that such components are provided as capacitors. As the high-withstand-voltage component, for example, a metal-oxide-metal (MOM) capacitor is employed. A MOM capacitor is formed by utilizing an interconnect structure above a semiconductor substrate. Since the MOM capacitor utilizes the interconnect structure, disposing other interconnect members or pads around or above the MOM capacitor is avoided so as not to affect the electrostatic capacitance. Further, a MOM capacitor has a large distance between electrodes, and as such, it occupies a large area per capacity. In contrast, a MOS capacitor, for example, is employed as the low-withstand-voltage component. A MOS capacitor is formed by utilizing a MOSFET structure. A MOS capacitor has a small distance between electrodes, and as such, it occupies a small area per capacity. Thus, use of a MOS capacitor, which is the low-withstand-voltage component, instead of the use of a MOM capacitor, which is the high-withstand-voltage component, contributes to the reduction of the area of the protection circuit.

Also, the protection circuit 1 according to the embodiment includes the transistor 30 having the drain connected to the power line PL1 and the source connected to the power line PL2, that is, the transistor 30 capable of directly short-circuiting the power lines PL1 and PL2. With this transistor 30, electric charges introduced by an ESD can be promptly discharged, while realizing a reduced area of the protection circuit.

To elaborate on the advantages of the transistor 30, two comparative examples will be considered. FIG. 2 is a circuit diagram showing an exemplary configuration of a protection circuit 1*a* according to the first comparative example. The protection circuit 1*a* according to the first comparative example differs from the protection circuit 1 according to the embodiments in that the trigger circuit 20 and the transistor 30 of the latter are replaced with a trigger circuit 40 and a transistor 50, respectively. The trigger circuit 40 detects a surge of a source voltage VCCL and controls the transistor 50. The transistor 50 is an n-type MOSFET. The trigger circuit 40 includes a capacitor 41 and a resistor 42. One electrode of the capacitor 41 is connected to the node N1. One end of the resistor 42 is connected to the power line PL2. The other electrode of the capacitor 41, the other end of the resistor 42, and the gate of the transistor 50 are connected to one another. The transistor 50 has its drain connected to the node N1. The source of the transistor 50 is connected to the power line PL2. The body of the transistor 50 is connected to the power line PL2.

In the protection circuit 1*a* according to the first comparative example, the transistor 50 for discharging electric charges introduced by an ESD is provided between the node N1 and the power line PL2. Accordingly, a discharging action between the power lines PL1 and PL2 uses a route through the transistors 13 and 50. The gate of the transistor 13 receives application of a voltage resulting from the voltage division with the resistors 11 and 12. As such, the transistor 13 has a low responsiveness to an ESD and it does not securely turn to an ON state upon ESD occurring. Since the transistor 13 serving as a discharging path is not securely turned ON in response to ESD occurring, the protection circuit 1*a* according to the first comparative example has an inferior discharging capability to that of the protection circuit 1 according to the embodiments. The protection circuit 1*a* according to the first comparative example would thus likely involve an occurrence of a high voltage on the power line PL1 in the event that ESD is applied.

FIG. 3 is a circuit diagram showing an exemplary configuration of a protection circuit 1*b* according to the second comparative example. The protection circuit 1*b* according to the second comparative example differs from the protection circuit 1 according to the embodiments in that the trigger circuit 20 and the transistor 30 of the latter are replaced with a trigger circuit 60 and a transistor 50, respectively, and further a pull-up circuit 70 is included. The trigger circuit 60 detects a surge of a source voltage VCCL and controls the transistor 50. The transistor 50 is an n-type MOSFET. The pull-up circuit 70 pulls up the gate of the transistor 13 based on the operation of the trigger circuit 60. The trigger circuit 60 includes a resistor 61, a capacitor 62, and an inverter 63. The resistor 61 has its one end connected to the node N1. One electrode of the capacitor 62 is connected to the power line PL2. The other end of the resistor 61, the other electrode of the capacitor 62, and the input end of the inverter 63 are connected to one another. The positive supply end of the inverter 63 is connected to the node N1. The negative supply end of the inverter 63 is connected to the power line PL2. The output end of the inverter 63 is connected to the gate of the transistor 50. The drain of the transistor 50 is connected to the node N1. The transistor 50 has its source connected to the power line PL2. The body of the transistor 50 is connected to the power line PL2.

The pull-up circuit 70 includes transistors 71 to 73 and a resistor 74. The transistors 71 and 72 are n-type MOSFETs. The transistor 73 is a p-type MOSFET. The gate of the transistor 71, the output end of the inverter 63, and the gate of the transistor 50 are connected to one another. The source of the transistor 71 is connected to the power line PL2. The body of the transistor 71 is connected to the power line PL2. The drain of the transistor 71, the source of the transistor 72, and the body of the transistor 72 are connected to one another. The gate of the transistor 72, the drain of the transistor 73, the other end of the resistor 11, the other end of the resistor 12, and the gate of the transistor 13 are connected to one another. The drain of the transistor 72, the gate of the transistor 73, and one end of the resistor 74 are connected to one another. The source of the transistor 73 is connected to the power line PL1. The body of the transistor 73 is connected to the power line PL1. The other end of resistor 74 is connected to the power line PL1.

The protection circuit 1b according to the second comparative example includes the pull-up circuit 70. The pull-up circuit 70 pulls up the gate of the transistor 13 in the regulator circuit 10, in response to the inverter 63 in the trigger circuit 60 giving an "H" level output, that is, upon detection of a voltage surge due to an ESD. This enables the protection circuit 1b according to the second comparative example to securely turn ON the transistor 13 at the occurrence of an ESD to the protection circuit 1b. Thus, the protection circuit 1b according to the second comparative example has a superior discharging capability to that of the protection circuit 1a according to the first comparative example.

As explained above, even in the configuration where the transistor 50 used for discharging is connected to the node N1 corresponding to the output of the regulator circuit 10, a given discharging capability can be secured by additionally providing the pull-up circuit 70 for the regulator circuit 10. However, an increase in the area of the protection circuit by as much as the area of the pull-up circuit 70 would be inevitable.

Moreover, in instances where a discharging path includes multiple transistors as in the first and second comparative examples, the resistance of the discharging path equals the sum of the resistances of the respective transistors included in the discharging path. It may be possible to increase the size of each transistor included in the discharging path in order to reduce the resistance of the discharging path; however, this would result in expansion of the area of the protection circuit.

The protection circuit 1 according to the embodiments includes the transistor 30 with its drain directly connected to the power line PL1 without any intervening transistors, and with its source directly connected to the power line PL2 without any intervening transistors. In other words, the discharging path is constituted by only one transistor. The protection circuit 1 according to the embodiments therefore allows for reduction of the area as compared to configurations where the discharging path includes multiple transistors.

\<4\> Modifications, Etc

The foregoing description of the embodiments has assumed, by way of example, that the trigger circuit 20 includes the transistor 22, i.e., a capacitor utilizing the transistor structure. Instead of the transistor 22, the trigger circuit 20 may include a capacitor not utilizing the transistor structure.

The foregoing description of the embodiments has assumed, by way of example, that the trigger circuit 20 includes the inverters 23 to 25 connected in series, that is, three serially connected inverters. The number of serially connected inverters in the trigger circuit 20 is not limited as long as it is an odd number, and it may be, for example, one, five, or other number. For example, and more specifically, in the case of one inverter, the configuration may be modified such that the inverters 24 and 25 are omitted from the trigger circuit 20, the output end of the inverter 23 is connected to the gate of the transistor 30, and the resistor 26 is disposed between the output end of the inverter 23 and the power line PL2. Such a configuration of the trigger circuit can also provide effects comparable to those of the embodiments above.

As used herein, the term "connect", "connection", or the like intends an electrically connected state and does not exclude cases where, for example, one or more other elements are arranged between the connected elements. Also, the "electrically connected" form may cover the form where one or more insulators are interposed, as long as an operation comparable to the operation by the electrically connected elements is possible. As used herein, the term "ON state" or the like indicates a state in which the gate of a corresponding transistor is being subjected to application of a voltage equal to or higher than its threshold voltage. The term "OFF state" or the like indicates a state in which the gate of a corresponding transistor is being subjected to application of a voltage lower than its threshold voltage, and this state does not exclude a state in which a subtle amount of a current such as a leak current of the transistor flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A protection circuit comprising:
a first power line;
a second power line;
a first transistor comprising a drain connected to the first power line and a source connected to the second power line;
a first resistor comprising one end connected to the first power line;
a second resistor comprising one end connected to the second power line;
a second transistor comprising a drain connected to the first power line, a source connected to a first node, and a gate connected to each of another end of the first resistor and another end of the second resistor; and
a trigger circuit connected to each of the first node and the second power line and configured to control the first transistor based on a voltage change of the first node.

2. The protection circuit according to claim 1, wherein the trigger circuit comprises
a third resistor comprising one end connected to the first node,
a first capacitor comprising one electrode connected to the second power line, and a first inverter comprising a positive supply end connected to the first node, a negative supply end connected to the second power line, and an input end connected to each of another end of the third resistor and another electrode of the first capacitor, and the trigger circuit is configured to control the first transistor based on an output of the first inverter.

3. The protection circuit according to claim 2, wherein the trigger circuit further comprises a second inverter comprising a positive supply end connected to the first node, a negative supply end connected to the second power line, and an input end connected to an output end of the first inverter, and a third inverter comprising a positive supply end connected to the first node, a negative supply end connected to the second power line, an input end connected to an output end of the second inverter, and an output end connected to a gate of the first transistor.

4. The protection circuit according to claim 2, wherein the first capacitor comprises a MOSFET structure.

5. A semiconductor device comprising:

a protection circuit comprising a first power line, a second power line, a first transistor, a first resistor comprising one end connected to the first power line, a second resistor comprising one end connected to the second power line, a second transistor comprising a drain connected to the first power line, a source connected to a first node, and a gate connected to each of another end of the first resistor and another end of the second resistor, and a trigger circuit connected to each of the first node and the second power line and configured to control the first transistor based on a voltage change of the first node;

a first terminal connected to the first power line and connectable with an outside entity; and a second terminal connected to the second power line and connectable with an outside entity, wherein the first transistor comprises a drain directly connected to the first power line without an intervening transistor, and a source directly connected to the second power line without an intervening transistor.

6. The semiconductor device according to claim 5, wherein the trigger circuit of the protection circuit comprises a third resistor comprising one end connected to the first node, a first capacitor comprising one electrode connected to the second power line, and a first inverter comprising a positive supply end connected to the first node, a negative supply end connected to the second power line, and an input end connected to each of another end of the third resistor and another electrode of the first capacitor, and the trigger circuit is configured to control the first transistor based on an output of the first inverter.

7. The semiconductor device according to claim 6, wherein the trigger circuit of the protection circuit further comprises a second inverter comprising a positive supply end connected to the first node, a negative supply end connected to the second power line, and an input end connected to an output end of the first inverter, and a third inverter comprising a positive supply end connected to the first node, a negative supply end connected to the second power line, an input end connected to an output end of the second inverter, and an output end connected to a gate of the first transistor.

8. The semiconductor device according to claim 6, wherein the first capacitor of the protection circuit comprises a MOSFET structure.

* * * * *